(12) United States Patent
Zhao et al.

(10) Patent No.: US 11,300,638 B2
(45) Date of Patent: Apr. 12, 2022

(54) LABORATORY TEST DEVICE FOR PERMEATION GROUTING OF IMPERMEABLE MATERIAL

(71) Applicant: Sun Yat-Sen University, Guangzhou (CN)

(72) Inventors: Hongfen Zhao, Guangzhou (CN); Jiping Chen, Guangzhou (CN); Qi Peng, Guangzhou (CN); Xueyou Li, Guangzhou (CN); Gangqiang Wang, Guangzhou (CN); Bingqiu Li, Guangzhou (CN); Feng Li, Guangzhou (CN)

(73) Assignee: SUN YAT-SEN UNIVERSITY, Guangzhou (CN)

( * ) Notice: Subject to any disclaimer, the term of this patent is extended or adjusted under 35 U.S.C. 154(b) by 354 days.

(21) Appl. No.: 16/561,603

(22) Filed: Sep. 5, 2019

(65) Prior Publication Data
US 2020/0072914 A1   Mar. 5, 2020

(30) Foreign Application Priority Data

Sep. 5, 2018 (CN) .......................... 201811029395.2

(51) Int. Cl.
*G01N 15/08* (2006.01)
*G01N 33/00* (2006.01)
*G01N 33/08* (2006.01)
*G01R 33/12* (2006.01)
*G01F 1/58* (2006.01)
*G01L 19/14* (2006.01)

(52) U.S. Cl.
CPC ........... *G01R 33/1223* (2013.01); *G01F 1/58* (2013.01); *G01L 19/142* (2013.01)

(58) Field of Classification Search
CPC ......... G01F 1/58; G01L 19/14; G01L 19/142; G01N 15/00; G01N 15/08; G01N 33/00; G01N 33/24; G01N 33/28; G01R 33/1223
See application file for complete search history.

(56) References Cited

FOREIGN PATENT DOCUMENTS

| CN | 105527384 A | * | 4/2016 | ............. G01N 33/00 |
| CN | 106814016 A | * | 6/2017 | |
| CN | 107782880 A | * | 3/2018 | ............. G01N 33/24 |

(Continued)

*Primary Examiner* — Nguyen Q. Ha
(74) *Attorney, Agent, or Firm* — Christopher M. Scherer; DeWitt LLP

(57) ABSTRACT

The present disclosure discloses a laboratory test device for permeation grouting of impermeable material, which comprises a slurry storage device with a stirrer, a grouting pump, electromagnetic flow meters, pressure sensors, a pressure chamber, a slurry collection tank, a pH value meter, a conductivity meter, electronic scales, an image acquisition system and a computer system. The computer system automatically acquires related data to save the labor, and the data is recorded completely so as to facilitate tests and researches. Software installed in the computer system can automatically process the data and displays a permeability coefficient in real time so as to achieve quick determination and real-time display of the permeability coefficient and facilitate development of laboratory tests and researches. Three pressure sensors are arranged on an organic glass cylinder of the pressure chamber at the equal intervals.

10 Claims, 4 Drawing Sheets

(56) References Cited

FOREIGN PATENT DOCUMENTS

| CN | 208653993 U | * | 3/2019 | ............. G01N 15/08 |
| CN | 109596814 A | * | 4/2019 | ............. G01N 33/24 |
| CN | 110045090 A | * | 7/2019 | ............. G01N 15/08 |

* cited by examiner

LABORATORY TEST DEVICE FOR PERMEATION GROUTING OF IMPERMEABLE MATERIAL

TECHNICAL FIELD

The present disclosure relates to the technical field of grouting construction tests, and in particular to a laboratory test device for permeation grouting of impermeable material.

BACKGROUND

Grouting is a construction method grouting a slurry having gelation ability into cracks, holes and cavities in a soil layer (or a rock strata) through a grouting pump by using hydraulic pressure, gas pressure and water among soil particles or in rock fractures in manners of filling, permeating, compacting, and the original loose soil particles or cracks are cemented to form a intact body having great impermeability and high strength in order to achieve a purpose of improving performances of the soil layer (or the rock strata).

During grouting construction of geotechnical engineering and underground engineering, a grouting principle mainly comprises three manners of permeation grouting, fracturing grouting and compaction grouting. The permeation grouting is: a slurry is filled of the holes of the soil and the fractures of rocks under pressure to push away free water and gas in the holes and the cracks, and the slurry forms a consolidated body having a certain strength and low water permeability in the holes by a physicochemical reaction to block or fill the holes so as to achieve consolidating and permeation resisting functions. The permeation grouting basically does not change the structure and the volume of undisturbed soil, and the used grouting pressure is relatively small, and the permeation grouting is applicable to gravel and sandy soils having at least medium sands.

The permeability reducing effect and the groutability are the most important indexes for evaluating the performance of an impermeable material, and the permeability reducing effect, namely the impermeable effect of the impermeable material, is generally evaluated by using a permeability coefficient.

A permeability coefficient determination method of the traditional laboratory comprises a constant head permeability test and a falling head permeability test. According to the constant head permeability test, in the whole testing process, a water head maintains a constant such that a water head difference is also a constant. In test, a saturated sample is filled in a transparent plastic cylinder; a valve is switched on such that water flows through the sample from top to bottom and is discharged through a water outlet; after the water head difference and leaked fluid are stable, the quantity of water flowing through the sample within a certain time is measured, and a permeability coefficient can be computed according to Darcy's law. The constant head permeability test is applicable to determining the permeability coefficient of sandy soils having large permeability. Clayed soils have small permeability and the quantity of leaked water, so, if the clayed soils are applied to the constant head permeability test, a test result is hard to be accurately determined, and at this time, the falling head permeability test should be adopted. According to the falling head permeability test, a falling head means that a water head difference is varying along the time in the testing process; the water flows through the soil sample from a vertical scaled glass tube and a U-shaped tube from bottom to top; in test, water is filled in the glass tube to a required height, then a stop watch starts to measure a start water head difference, and after passing a certain time, a water head difference is remeasured, finally an instant Darcy's law is established to deduce an expression of the permeability coefficient.

During research and application of the impermeable material, the groutability of the slurry is also very important besides its permeability reducing effect.

When the slurry is grouted into a general stratum, to obtain an excellent grouting effect, the slurry should keep great fluidity in a pumping period, and viscosity increase is not great, which is the groutability, thereby facilitating the slurry to be fully grouted into the holes and the cracks of the stratum. When the slurry flows in the cracks, a certain frictional resistance is generated in the slurry and between the slurry and the walls of the holes, and the form and the size of this resistance also are rheological properties of the slurry and are important factors to influence the groutability. The groutability of the slurry can be studied and verified by using the grouting test.

The laboratory grouting test is an necessary manner for studying the grouting of rock and soil bodies.

The traditional constant head permeability test and falling head permeability test take a relatively long time to determine the permeability coefficient and cannot automatically acquire and record data, which are not beneficial to development of tests and researches and cannot simulate the groutability of the impermeable material. Additionally, the permeability coefficient determined by the constant head permeability test and the falling head permeability test is an average permeability coefficient of a whole soil sample and cannot reflect the permeability coefficient of a certain grouting area.

SUMMARY

An objective of the present disclosure is to provide a laboratory test device for permeation grouting of impermeable material in order to solve the problems in the prior art. By determining variation of a permeability coefficient of a sample before and after a test, a permeability reducing effect of an impermeable material is quantitatively evaluated, and accurate, automatic and quick determination of the permeability coefficient can also be achieved; and a groutability research of the impermeable material can also be developed, and applicability of the impermeable material is qualitatively evaluated.

To achieve the above objective, the present disclosure provides the following solution: the laboratory test device for permeation grouting of impermeable material is provided by the present disclosure and comprises a slurry storage device, a grouting pump, a pressure chamber, a slurry collection tank and a computer system, and the slurry storage device is connected with an inlet of the pressure chamber through the grouting pump while an outlet of the pressure chamber is connected with the slurry collection tank; the slurry collection tank and the slurry storage device are respectively located on a first electronic scale and a second electronic scale, which are connected with the computer system, and a first electromagnetic flow meter and a second electromagnetic flow meter, which are connected with the computer system, are respectively arranged on a connection pipe of the grouting pump and the pressure chamber and a connection pipe of the pressure chamber and the slurry collection tank; the inlet and the outlet are respectively equipped with a lower pressure sensor and an upper pressure sensor, which are connected with the computer system; and a soil sample for testing is located in the pressure chamber, and an impermeable material solution is located in the slurry storage device.

Preferably, the slurry storage device comprises a slurry storage tank, a slurry storage tank top cover, a direct-current micro-motor and stirring blades, the direct-current micro-motor is fixed to the slurry storage tank top cover, and one end of a connecting shaft is connected with an output end of the direct-current micro-motor through the slurry storage tank top cover while the other end there of is fixed to the stirring blades inside the slurry storage tank; and a bottom side of the slurry storage tank is connected with a connection pipe of the grouting pump through an outlet valve.

Preferably, the slurry storage device is connected with the grouting pump by using a pressure-resistant grouting pipe.

Preferably, the pressure chamber is cylindrical and comprises a base, an organic glass cylinder and a top cover, which are sealed and connected sequentially from bottom to top, an O-shaped slot is respectively arranged at a contact part of the base and the organic glass cylinder and a contact part of the top cover and the organic glass cylinder, and an O-ring is mounted in the O-shaped slot; and the base and the top cover are also made of transparent organic glass.

Preferably, a screw sequentially penetrates the top cover, the organic glass cylinder and the base from top to bottom to be fixed.

Preferably, three holes are arranged in the organic glass cylinder at equal intervals, and a pressure sensor A, a pressure sensor B and a pressure C, which are connected with the computer system, are respectively arranged in the three holes from bottom to top.

Preferably, a screen is arranged on one side, close to each pressure sensor, in the organic glass cylinder; and a grouting distribution plate is arranged in the organic glass cylinder above the base. The grouting distribution plate can ensure uniformity of grouting.

Preferably, a lower three-way valve is mounted on the inlet, and the other two openings of the lower three-way valve are respectively connected with the grouting pump and the lower pressure sensor through a lower three-way valve port A and a lower three-way valve port B; an upper three-way valve is mounted on the outlet, and the other two openings of the upper three-way valve are respectively connected with the slurry collection tank and the upper pressure sensor through an upper three-way valve port A and an upper three-way valve port B.

Preferably, the slurry collection tank is provided with a pH value meter and a conductivity meter, which are connected with the computer system.

Preferably, the laboratory test device for permeation grouting of impermeable material further comprises an image acquisition system, the image acquisition system comprises a camera and a video camera, which are connected with the computer system, and a lens of the camera and a lens of the video camera face to the pressure chamber.

Compared with the prior art, the present disclosure achieves the following technical effects:

1. the test device is composed of the slurry storage device with a stirrer, the grouting pump, the electromagnetic flow meters, the pressure sensors, the pressure chamber, the slurry collection tank, the pH value meter, the conductivity meter, the electronic scales, the image acquisition system and the computer system; the computer system automatically acquires related data to save the labor, and the data is recorded completely so as to facilitate tests and researches; and software installed in the computer system can automatically process the data and displays the permeability coefficient in real time so as to achieve quick determination and real-time display of the permeability coefficient and facilitate development of laboratory tests and researches;

2. the base, the organic glass cylinder and the top cover of the pressure chamber are made of the transparent organic glass so as to achieve the visibility of the test device, and ensure that the image acquisition system can record the testing process;

3. the three pressure sensors are arranged on the organic glass cylinder of the pressure chamber at the equal intervals; by the pressure sensors arranged on the pressure chamber at different heights, the permeability coefficients of a soil sample at the pressure sensors can be computed, and a permeability coefficient reduction situation after grouting can be accurately reflected; and in order to prevent the soil sample from entering the pressure sensors in the grouting process, the screens are mounted on the inner sides of the organic glass cylinder;

4. the grouting distribution plate is arranged on the base so as to ensure the uniformity of the grouting;

5. a breakthrough point of the impermeable material to fully grout the soil sample can be obtained according to variations of a pH value and a conductivity; pictures and images recorded by the image acquisition system are post-processed to be capable of obtaining a time-varying grouting situation of the impermeable material; and a diffusion principle of the impermeable material can be studied by comprehensive analysis (such as grouting height, permeability coefficient variation, flow velocity and the like); and 6. the groutability of slurry can be comprehensively evaluated according to the data and the images.

BRIEF DESCRIPTION OF THE DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Figure 1:
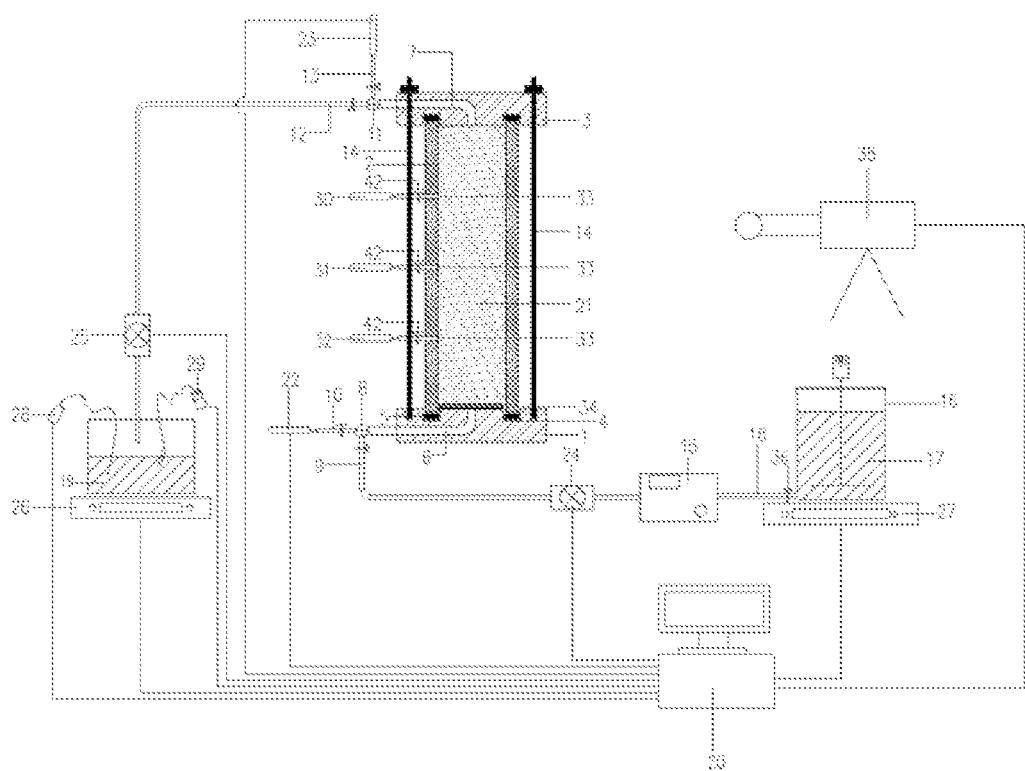
FIG. 1 is a schematic diagram of a laboratory test device for permeation grouting of impermeable material.

In the drawings: 1-base, 2-organic glass cylinder, 3-top cover, 4-O-shaped slot, 5-O-ring, 6-inlet, 7-outlet, 8-lower three-way valve, 9-lower three-way valve port A, 10-lower three-way valve port B, 11-upper three-way valve, 12-upper three-way valve port A, 13-upper three-way valve port B, 14-screw, 15-grouting pump, 16-slurry storage device, 17-impermeable material solution, 18-pressure-resistant grouting pipe, 19-slurry collection tank, 20-computer system, 21-soil sample, 22-lower pressure sensor, 23-upper pressure sensor, 24-first electromagnetic flow meter, 25-second electromagnetic flow meter, 26-first electronic scale, 27-second electronic scale, 28-pH value meter, 29-conductivity meter, 30-pressure sensor A, 31-pressure sensor B, 32-pressure sensor C, 33-screen, 34-grouting distribution plate, 35-image acquisition system, 36-outlet valve, 37-direct-current micromotor, 38-slurry storage tank top cover, 39-slurry storage tank, 40-connecting shaft, 41-stirring blade, and 42-valve.

DESCRIPTION OF THE EMBODIMENTS

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

An objective of the present disclosure is to provide a laboratory test device for permeation grouting of impermeable material in order to solve the problems in the prior art. By determining variation of a permeability coefficient of a sample before and after a test, a permeability reducing effect of an impermeable material is quantitatively evaluated, and accurate, automatic and quick determination of the permeability coefficient and groutability research of the impermeable material can also be achieved; and the groutability research of the impermeable material can also be developed, and applicability of the impermeable material is qualitatively evaluated.

The present disclosure provides the laboratory test device for permeation grouting of impermeable material, which comprises a slurry storage device, a grouting pump, a pressure chamber, a slurry collection tank and a computer system, and the slurry storage device is connected with an inlet of the pressure chamber through the grouting pump while an outlet of the pressure chamber is connected with the slurry collection tank; the slurry collection tank and the slurry storage device are respectively located on a first electronic scale and a second electronic scale, which are connected with the computer system, and a first electromagnetic flow meter and a second electromagnetic flow meter, which are connected with the computer system, are respectively arranged on a connection pipe of the grouting pump and the pressure chamber and a connection pipe of the pressure chamber and the slurry collection tank; the inlet and the outlet are respectively equipped with a lower pressure sensor and an upper pressure sensor, which are connected with the computer system; and a soil sample for testing is located in the pressure chamber, and an impermeable material solution is located in the slurry storage device.

To make the foregoing objective, features, and advantages of the present disclosure clearer and more comprehensible, the present disclosure is further described in detail below with reference to the accompanying drawings and specific embodiments.

Figure 2:
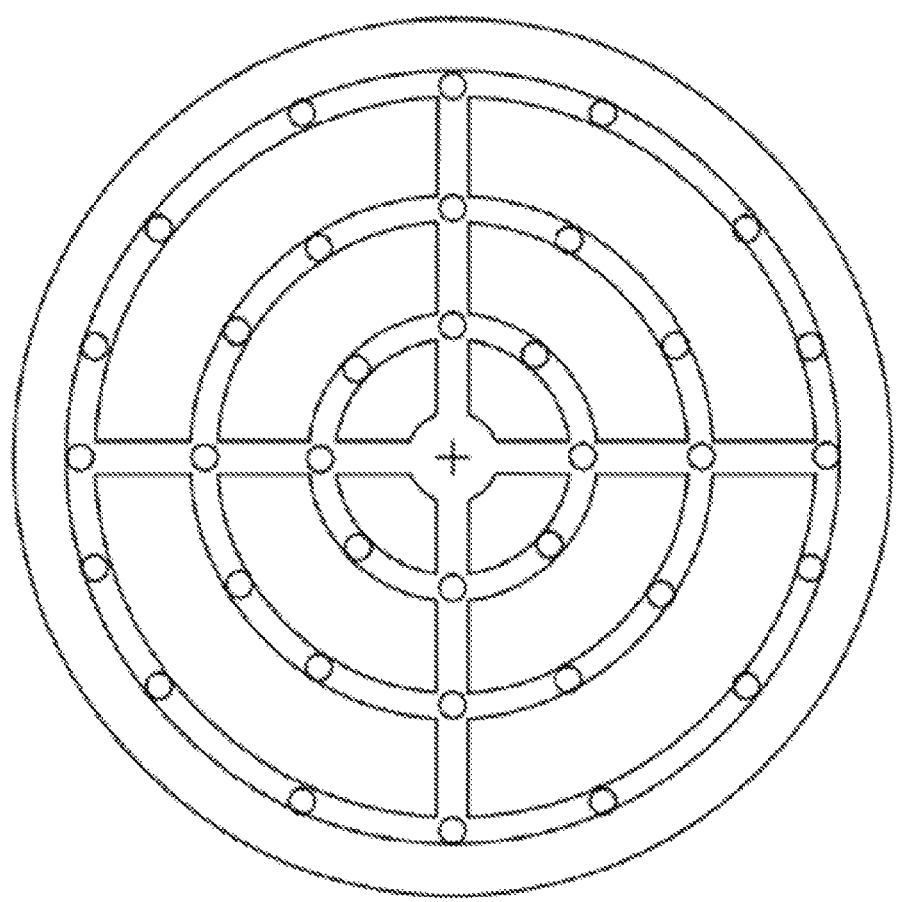
FIG. 2 is a schematic diagram of a slurry storage device with a stirrer.
Figure 3:
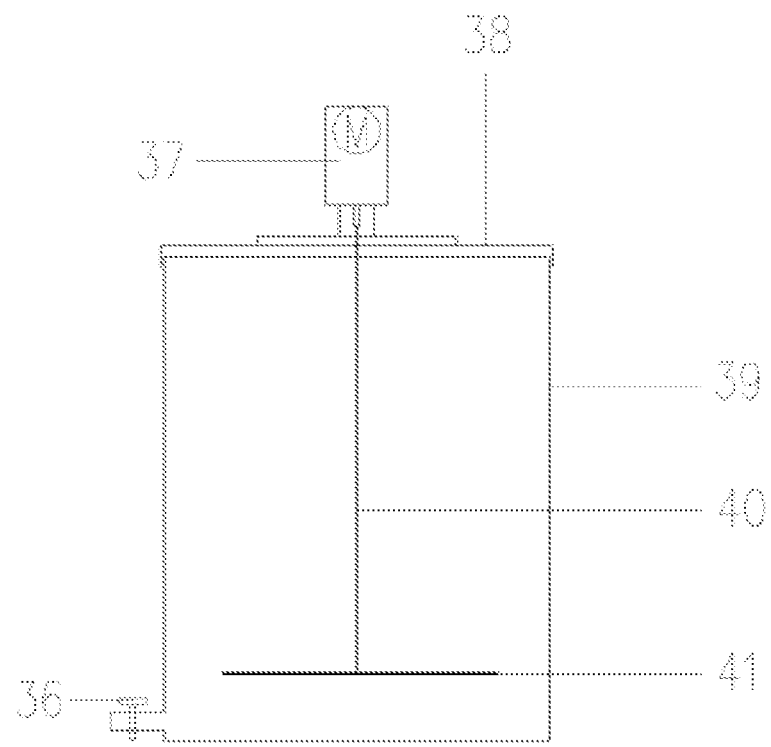
FIG. 3 is a schematic diagram of a grouting distribution plate.
Figure 4:
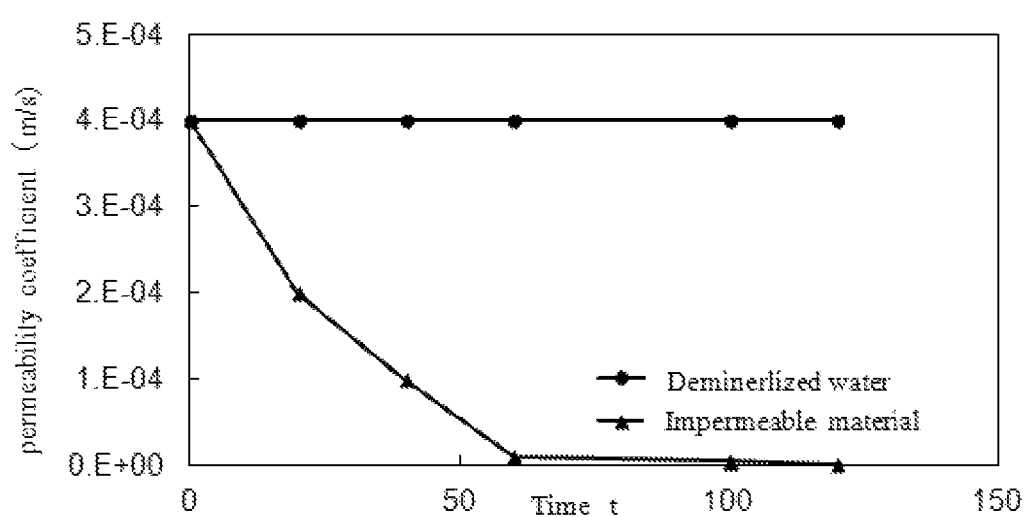
FIG. 4 is a data processing diagram of a permeability coefficient.
Figure 5:
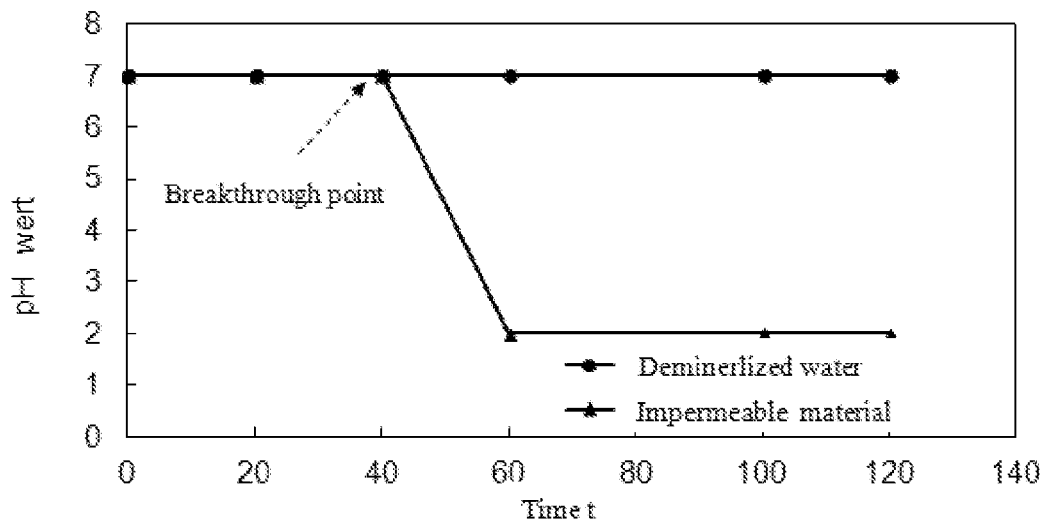
FIG. 5 is a data processing diagram of a pH value.
Figure 6:
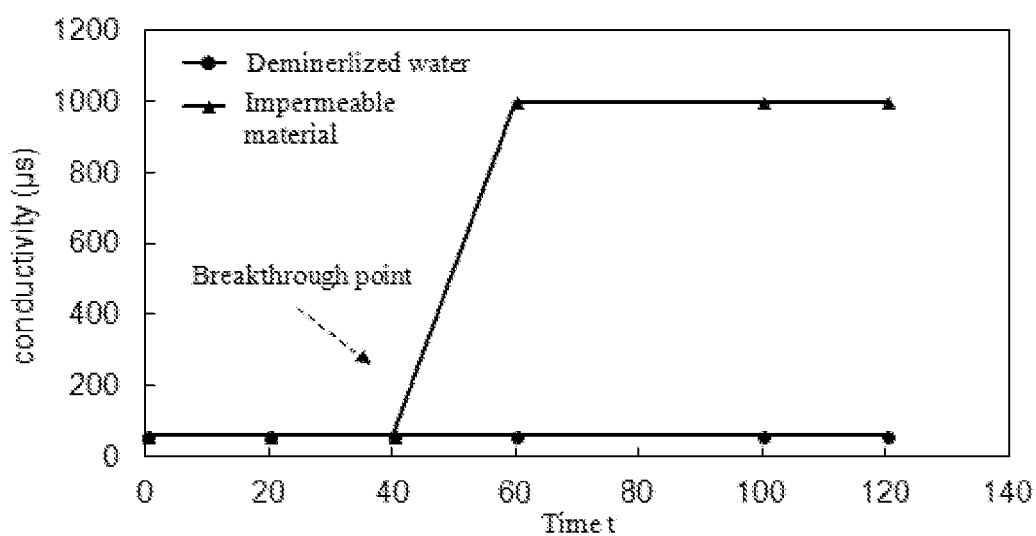
FIG. 6 is a data processing diagram of a conductivity.

Referring to FIG. 1 to FIG. 6, wherein FIG. 1 is a schematic diagram of a laboratory test device for permeation grouting of impermeable material; FIG. 2 is a schematic diagram of a slurry storage device with a stirrer; FIG. 3 is a schematic diagram of a grouting distribution plate; FIG. 4 is a data processing diagram of a permeability coefficient; FIG. 5 is a data processing diagram of a pH value; and FIG. 6 is a data processing diagram of a conductivity.

As shown in FIG. 1 to FIG. 6, the present disclosure provides the laboratory test device for permeation grouting of impermeable material, which comprises a slurry storage device 16, a grouting pump 15, a pressure chamber, a slurry collection tank 19 and a computer system 20, and the slurry storage device 16 is connected with an inlet 6 of the pressure chamber through the grouting pump 15 while an outlet 7 of the pressure chamber is connected with the slurry collection tank 19; the slurry collection tank 19 and the slurry storage device 16 are respectively located on a first electronic scale 26 and a second electronic scale 27, which are connected with the computer system 20, and a first electromagnetic flow meter 24 and a second electromagnetic flow meter 25, which are connected with the computer system 20, are respectively arranged on a connection pipe of the grouting pump 15 and the pressure chamber and a connection pipe of the pressure chamber and the slurry collection tank 19; the inlet 6 and the outlet 7 are respectively equipped with a lower pressure sensor 22 and an upper pressure sensor 23, which are connected with the computer system 20; and a soil sample 21 for testing is located in the pressure chamber, and an impermeable material solution 17 is located in the slurry storage device 16.

A lower three-way valve 8 is mounted on the inlet 6, and the other two openings of the lower three-way valve 8 are respectively connected with the grouting pump 15 and the lower pressure sensor 23 through a lower three-way valve port A 9 and a lower three-way valve port B 10; an upper three-way valve 11 is mounted on the outlet 7, and the other two openings of the upper three-way valve 11 are respectively connected with the slurry collection tank 19 and the upper pressure sensor 22 through an upper three-way valve port A 12 and an upper three-way valve port B 13. The pressure sensors are connected to the computer system 20 through conductors and are used for continuously monitoring the pressure of the inlet and the pressure of the outlet in a grouting test process. In order to ensure the seal performance, the inlet 6 and the outlet 7 are respectively provided with inner threads, and the three-way valves are screwed in the inlet and the outlet to be mounted.

The slurry storage device 16 comprises a slurry storage tank 39, a slurry storage tank top cover 38, a direct-current micro-motor 37 and stirring blades 41, the direct-current micro-motor 37 is fixed to the slurry storage tank top cover 38, and one end of a connecting shaft 40 is connected with a motor shaft end of the direct-current micro-motor 37 through the slurry storage tank top cover 38 while the other end thereof is fixed to the stirring blades 41 inside the slurry storage tank 39; there are three stirring blades 41; and a bottom side of the slurry storage tank 39 is connected with a connection pipe of the grouting pump 15 through an outlet valve 36, and the connection pipe is a pressure-resistant grouting pipe 18. The impermeable material solution 17 is located in the slurry storage tank 39, and the grouting pump 15 is connected with the slurry storage tank 39 by using the pressure-resistant grouting pipe 18. An outlet of the slurry storage tank 39 is equipped with the outlet valve 36 and is sequentially connected with the first electromagnetic flow meter 24 and the lower three-way valve port A 9, and the slurry collection tank 19 is sequentially connected with the second electromagnetic flow meter 25 and the upper three-way valve port A 12. The first electromagnetic flow meter 24 and the second electromagnetic flow meter 25 can measure the quantities of flow-in slurry and flow-out slurry and can measure instant flow velocity. The first electromagnetic flow meter 24 and the second electromagnetic flow meter 25 are connected to the computer system 20 and can record accumulated flow rates and flow velocities in real time.

The slurry collection tank 19 and the slurry storage tank 39 are respectively placed on the first electronic scale 26 and the second electronic scale 27, and the electronic scales are connected with the computer system 20 and can automatically record the quantities of grouting slurry and flow-out slurry. The slurry collection tank 19 is provided with the pH value meter 28 and the conductivity meter 29, the pH value meter 28 and the conductivity meter 29 can be connected with the computer system 20 and can monitor and record a pH value and a conductivity of the flow-out slurry in real time, and a grouting breakthrough point can be disclosed according to the pH value and the conductivity.

The pressure chamber is cylindrical and is a sealed chamber formed by the base 1, the organic glass cylinder 2 and the top cover 3. In order to ensure the seal performance of the pressure chamber, an O-shaped slot 4 is respectively arranged at a contact part of the base 1 and the organic glass cylinder 2 and a contact part of the top cover 3 and the organic glass cylinder 2, and an O-ring 5 is mounted in the O-shaped slot 4. The base 1, the organic glass cylinder 2 and the top cover 3 are fixed by a screw.

Three holes are arranged in the organic glass cylinder 2 at equal intervals and are respectively connected with a pressure sensor A 30, a pressure sensor B 31 and a pressure C 32. In order to ensure the seal performance, the three holes are respectively internally provided with inner threads, and the valves are screwed in the holes to be mounted. By the pressure sensors arranged on the pressure chamber at different heights, the permeability coefficients of a soil sample 21 at every sections can be computed, and a permeability coefficient reduction situation after grouting can be accurately reflected. In order to prevent the soil sample 21 from entering the pressure sensors in the grouting process, screens 33 are mounted on the inner sides of the organic glass cylinder 2.

In order to ensure the uniformity of grouting, a grouting distribution plate 34 is arranged above the base 1, the thickness of the grouting distribution plate 34 is 3 mm, and small holes having the diameter of 4 mm are formed in the grouting distribution plate, which is specifically shown in FIG. 2 which is a schematic diagram of the grouting distribution plate 34.

In order to ensure the visibility of the test device, the base 1, s pressure chamber side ring and the top cover 3 are made of transparent organic glass. The image acquisition system 35 comprises a camera and a video camera and is connected to the computer system 20. In view of the visibility of the test device, the image acquisition system 35 can take photos to observe and record the grouting process (including grouting height and grouting velocity).

The grouting pump 15 provides a power source for the test and is an important device of the test device. The test device selects a continuous impulse-free circulation dual pump capable of operating at a constant speed under constant pressure. The pump has the highest work pressure of 3 MPa and the flow velocity in a range of 0.01 to 30 mL/min, and has pressure protection and position upper-limit and lower-limit protection.

A testing method of the present disclosure comprises the following steps:

1. mounting a sample:
mounting the O-rings 5 and the grouting distribution plate 34 on the transparent organic glass base 1, and putting the organic glass cylinder 2 into the O-shaped slots 4 on the base 1; mounting the screens 33; and filling the sample in the organic glass cylinder 2, and after the filling of the sample is completed, mounting the top cover 3 equipped with the O-rings 5 on the organic glass cylinder 2 and mounting the screw 14;

2. preparing an impermeable material solution:
preparing an impermeable material solution and filling the impermeable material solution in the slurry storage tank 39;

3. connecting the test device:
connecting a laboratory grouting test device of the impermeable material according to the above test device introduction and FIG. 1; and in order to ensure the seal performance, using a PTFE tape when mounting the lower three-way valve 8, the upper three-way valve 11 and the valve 42;

4. starting the grouting pump 15 at a certain velocity:
firstly filling deaerated distilled water into the sample in the transparent organic glass cylinder 2 at a certain velocity, measuring a pH value and a conductivity of water flowing out of the transparent organic glass cylinder 2 and into the slurry collection tank 19, and measuring a permeability coefficient of the soil sample to be reference values;

5. grouting an impermeable material slurry 17 into the sample in the organic glass cylinder 2, and starting the stirrer of the slurry storage device before the slurry is grouted such that the slurry is stirred uniformly;

6. in the testing process, by the computer system, automatically collecting reading values of the sensors and the meters, including the lower pressure sensor 22, the upper pressure sensor 23, the pressure sensor A 30, the pressure sensor 31, the pressure sensor C 32, the pH value meter 28, the conductivity meter 29, the electromagnetic flow meters and the electronic scales; and by the image acquisition system 35, automatically recording the state of the soil sample in the testing process;

7. after the test is finished, setting a fluid pressure of the grouted solution and a fluid pressure of the flow-out solution, which are respectively measured by the lower pressure sensor 22 and the upper pressure sensor 23, to be P1 and P2; and by the electromagnetic flow meters, automatically recording a flow quantity q (m³) in the testing process;

8. processing and computing test data:
computing the permeability coefficient of the sample by using the following formula:

$$K = \frac{Q}{A} \cdot \frac{L}{\Delta P}$$

Wherein
Q represents the flow quantity of the grouted impermeable material solution (m³/s), and Q=q/t;
A represents the sectional area of the sample (m2);
L represents the length of the sample (m);
t represents the duration of the test (s);
$\Delta P = P1 - P2$
$\Delta P$ represent the pressure difference of the sample between the inlet and the outlet (kPa);
P1 represent the pressure of the sample at the inlet (kPa); and
P2 represent the pressure of the sample at the outlet (kPa);

9. by software installed in the computer system, automatically processing the data and displaying the permeability coefficient in real time so as to achieve quick determination of the permeability coefficient;

10. obtaining a breakthrough point of the impermeable material to fully grout the soil sample 21 according to variations of the pH value and the conductivity, as shown in FIG. 5 which is a data processing diagram of a pH value and FIG. 6 which is a data processing diagram of a conductivity;

11. post-processing pictures and images recorded by the image acquisition system 35 to be capable of obtaining a time-varying grouting situation of the impermeable material; comprehensively analysing (such as grouting height, permeability coefficient variation, flow velocity and the like) to be capable of studying a diffusion principle of the impermeable material; and obtaining post-processed pictures of the image acquisition system; and 12. comprehensively evaluating the groutability of slurry according to the data and the images.

Several examples are used for illustration of the principles and implementation methods of the present disclosure. The description of the embodiments is used to help illustrate the method and its core principles of the present disclosure. In addition, those skilled in the art can make various modifications in terms of specific embodiments and scope of application in accordance with the teachings of the present disclosure. In conclusion, the content of this specification shall not be construed as a limitation to the present disclosure.

What is claimed is:

1. A laboratory test device for permeation grouting of impermeable material, comprising a slurry storage device, a grouting pump, a pressure chamber, a slurry collection tank and a computer system, wherein the slurry storage device is connected with an inlet of the pressure chamber through the grouting pump while an outlet of the pressure chamber is connected with the slurry collection tank; the slurry collection tank and the slurry storage device are respectively located on a first electronic scale and a second electronic scale, which are connected with the computer system, and a first electromagnetic flow meter and a second electromagnetic flow meter, which are connected with the computer system, are respectively arranged on a connection pipe of the grouting pump and the pressure chamber and a connection pipe of the pressure chamber and the slurry collection tank; the inlet and the outlet are respectively equipped with a lower pressure sensor and an upper pressure sensor, which are connected with the computer system; and a soil sample for testing is located in the pressure chamber, and an impermeable material solution is located in the slurry storage device.

2. The laboratory test device for permeation grouting of impermeable material according to claim 1, wherein the slurry storage device comprises a slurry storage tank, a slurry storage tank top cover, a direct-current micro-motor and stirring blades, the direct-current micro-motor is fixed to the slurry storage tank top cover, and one end of a connecting shaft is connected with an output end of the direct-current micro-motor through the slurry storage tank top cover while the other end thereof is fixed to the stirring blades inside the slurry storage tank; and a bottom side of the slurry storage tank is connected with a connection pipe of the grouting pump through an outlet valve.

3. The laboratory test device for permeation grouting of impermeable material according to claim 1, wherein the slurry storage device is connected with the grouting pump by using a pressure-resistant grouting pipe.

4. The laboratory test device for permeation grouting of impermeable material according to claim 1, wherein the pressure chamber is cylindrical and comprises a base, an organic glass cylinder and a top cover, which are sealed and connected sequentially from bottom to top, an O-shaped slot is respectively arranged at a contact part of the base and the organic glass cylinder and a contact part of the top cover and the organic glass cylinder, and an O-ring is mounted in the O-shaped slot; and the base and the top cover are also made of transparent organic glass.

5. The laboratory test device for permeation grouting of impermeable material according to claim 4, wherein a screw sequentially penetrates the top cover and the base from top to bottom so as to fix the organic glass cylinder in between.

6. The laboratory test device for permeation grouting of impermeable material according to claim 4, wherein three holes are arranged in the organic glass cylinder at equal intervals, and a pressure sensor A, a pressure sensor B and a pressure C, which are connected with the computer system, are respectively arranged in the three holes from bottom to top.

7. The laboratory test device for permeation grouting of impermeable material according to claim 6, wherein a screen is arranged on one side, close to each pressure sensor, in the organic glass cylinder; and a grouting distribution plate is arranged in the organic glass cylinder above the base.

8. The laboratory test device for permeation grouting of impermeable material according to claim 1, wherein a lower three-way valve is mounted on the inlet, and the other two openings of the lower three-way valve are respectively connected with the grouting pump and the lower pressure sensor through a lower three-way valve port A and a lower three-way valve port B; an upper three-way valve is mounted on the outlet, and the other two openings of the upper three-way valve are respectively connected with the slurry collection tank and the upper pressure sensor through an upper three-way valve port A and an upper three-way valve port B.

9. The laboratory test device for permeation grouting of impermeable material according to claim 1, wherein the slurry collection tank is provided with a pH value meter and a conductivity meter, which are connected with the computer system.

10. The laboratory test device for permeation grouting of impermeable material according to claim 1, further comprising an image acquisition system, wherein the image acquisition system comprises a camera and a video camera, which are connected with the computer system, and a lens of the camera and a lens of the video camera face to the pressure chamber.

* * * * *